United States Patent [19]
Fink et al.

[11] Patent Number: 5,847,450
[45] Date of Patent: Dec. 8, 1998

[54] MICROCONTROLLER HAVING AN N-BIT DATA BUS WIDTH WITH LESS THAN N I/O PINS

[75] Inventors: Scott Fink, Glendale; Gregory C. Bingham, Gilbert; Richard Hull; Scott Ellison, both of Chandler, all of Ariz.

[73] Assignee: Microchip Technology Incorporated, Chandler, Ariz.

[21] Appl. No.: 644,916

[22] Filed: May 24, 1996

[51] Int. Cl.$^6$ .................................................. H01L 23/02
[52] U.S. Cl. .......................... 257/697; 257/723; 395/674
[58] Field of Search .................................... 257/723, 697, 257/701, 80; 395/674, 705, 800.25, 800.01

[56] References Cited

U.S. PATENT DOCUMENTS 5,502,333   3/1996   Bertin et al. ............................ 257/723

Primary Examiner—Tom Thomas
Assistant Examiner—Roy Potter
Attorney, Agent, or Firm—Harry M. Weiss; Jeffrey D. Moy; Harry M. Weiss & Associates, P.C.

[57] ABSTRACT

An Integrated Circuit (IC) package is disclosed comprising an IC chip with a microcontroller therein having an n-bit data bus, and up to n pins electrically coupled to the microcontroller. The IC package also includes a control register coupled to the microcontroller for receiving enable and disable signals from the microcontroller. One or more of the pins have one or more functional block associated thereto. Each functional block defines a specified function for its corresponding pin. Thus, each pin having a plurality of corresponding functional blocks has a number of potential functions equal to the number of corresponding functional blocks. The specific function for a given pin is selected by the enable signal from the control register which selects the appropriate functional block upon appropriate command from the microcontroller. BY using pins with multiple functions, the instant invention permits an n-bit architecture microcontroller to use less than or equal to n pins.

14 Claims, 1 Drawing Sheet

2

MICROCONTROLLER HAVING AN N-BIT DATA BUS WIDTH WITH LESS THAN N I/O PINS

BACKGROUND OF THE INVENTION

1. Field of the Invention

This invention is in the field of microcontrollers and methods therefor and, more particularly, is a microcontroller having an n-bit architecture (i.e., data bus width) with less than a Input/Output (I/O) pins and a method therefore.

2. Description of the Related Art

Microcontrollers are widely known and used in many different applications. A typical architecture used in microcontrollers today is the 8-bit architecture (i.e. the data bus width of the microcontroller is 8 bits wide). One problem with this and other sizes of microcontrollers is that to support an n-bit architecture, greater than n pins are required to be connected to the microcontroller. By reducing the number of pins required to support an n-bit, or more particularly, an 8-bit microcontroller, the overall cost of using the device is reduced, and limited space is conserved. Therefore, there existed a need to provide a microcontroller having an n-bit architecture with less than or equal to n pins and a method therefor.

SUMMARY OF THE INVENTION

An object of the present invention is to provide a microcontroller having an n-bit architecture with less than or equal to n pins coupled to the microcontroller and a method therefor.

Another object of the present invention is to provide a microcontroller having an n bit architecture with the number of I/O pins less than n and a method therefor.

Yet another object of the present invention is to provide a microcontroller package with pins for performing multiple functions and a method therefor.

Still another object of the present invention is to provide a microcontroller with n-bit data processing capability and fewer than n I/O pins and a method therefor.

BRIEF DESCRIPTION OF THE PREFERRED EMBODIMENTS

According to the present invention an Integrated Circuit (IC) package is disclosed comprising, in combination, an IC chip with a microcontroller therein having an n-bit data bus, and up to n pins electrically coupled to the microcontroller. The IC package further comprises control register means coupled to the microcontroller for receiving enable and disable signals. Pin function configuration means are also included coupled to the control register means for determining a function for a corresponding one of the n pins. The pin function configuration means comprises at least one functional block means coupled to the control register means for determining a function for a corresponding pin. The pin function configuration means may comprise a plurality of the functional block means each coupled to the control register means and to a corresponding pin of the n pins for determining a different function for the corresponding one of the n pins. The control register means provides independent control line means to each functional block means for transferring to each function block means one of the enable and the disable signals. Only one of the functional block means per pin is enabled at a time by the enable signal to configure a corresponding pin for a function associated with the enabled functional block means. Each functional block means is coupled to a corresponding one of the n pins and to the microcontroller for transferring data between the corresponding pin and the microcontroller when a particular one of the functional blocks is enabled. Additionally, the n pins include a number of Input/Output (I/O) type pins less than n.

Alternatively, a method of operating an Integrated Circuit (IC) package is disclosed comprising the steps of providing an IC chip with a microcontroller therein having an n-bit data bus, and providing up to n pins electrically coupled to the microcontroller.

The foregoing and other objects, features, and advantages of the invention will be apparent from the following, more particular, description of the preferred embodiments of the invention, as illustrated in the accompanying drawing.

DESCRIPTION OF THE PREFERRED EMBODIMENTS

Figure 1:
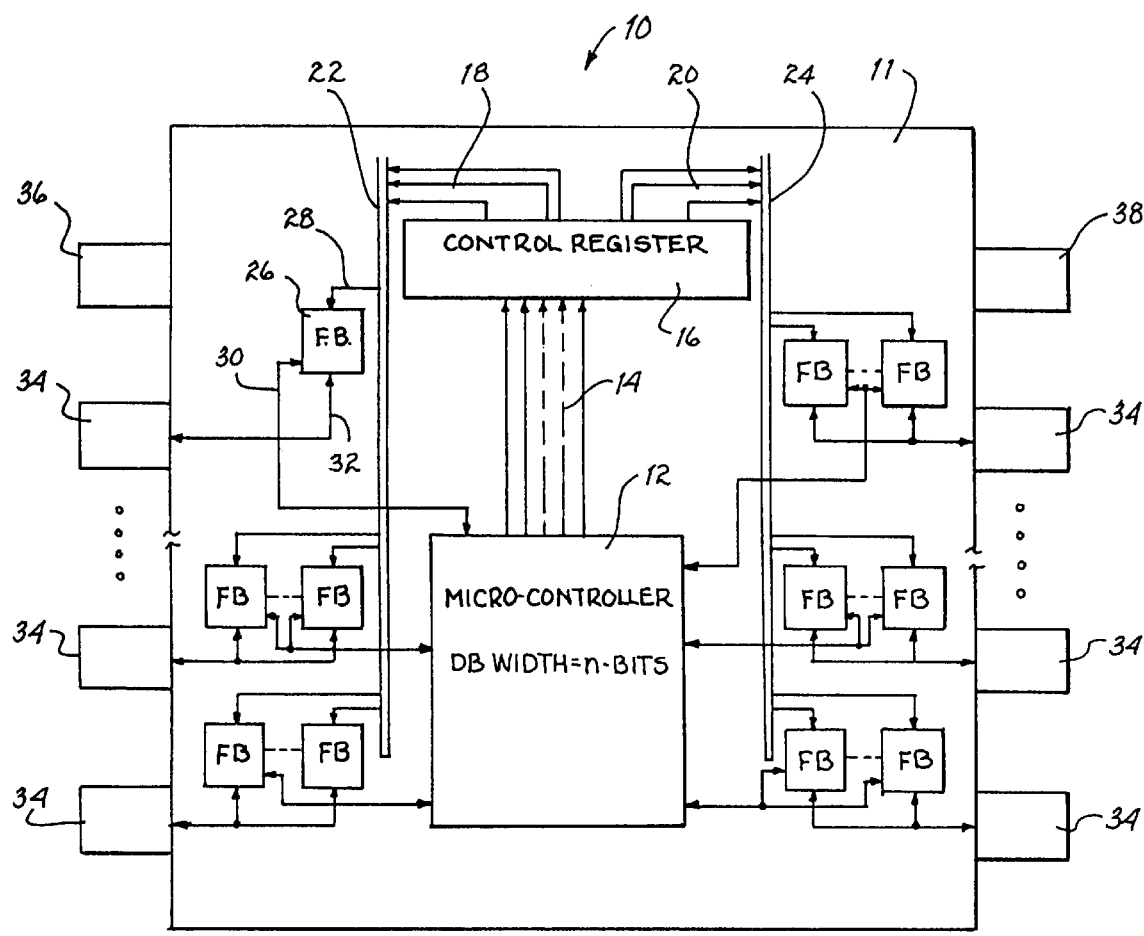
FIG. 1 is a simplified block diagram view of the IC microcontroller package having an n-bit data bus and n pins.

Referring to FIG. 1, the IC package or package of the instant invention is shown and generally designated by reference number 10. IC package 10 comprises an IC chip 11 with a microcontroller core or simply microcontroller 12 therein having an n-bit Data Bus (DB), and up to n pins 34–38 electrically coupled to the microcontroller 12. The manner of fabricating IC packages 10, chips 11, and microcontrollers 12 are well known to those skilled in the art. Microcontroller 12 has, in general, an n-bit wide data bus, but more specifically here an 8-bit architecture or data bus width. Note that the data bus itself is not shown in detail for simplification of the drawing.

The IC package 10 further comprises a control register 16 coupled to the microcontroller 12 via a control signal bus 14 for receiving enable and disable signals from the microcontroller 12. Control registers are well known to those skilled in the art. The control register 16 can be any element that can hold a known state (i.e., charge, current, or voltage) such as SRAM, DRAM, EPROM, EEPROM, ROM, Combinational Logic, PROM, or the like. The control register 16 provides sufficient memory capacity to store and transfer the enable and disable signals sent from the microcontroller 12 to the functional blocks 26, which will be described later. The communications protocol for sending the enable and disable signasl from the microcontroller 12 to the functional blocks 26 via the control register 16 is well known to those skilled in the art. The enable and disable signals are routed from the control register 16 to the appropriate functional blocks 26 via buses 18–24. From buses 22 and 24, each functional block 26 is coupled via connectors 28 to receive the enable or disable signal sent from the control register 16. Note also that each functional block 26 has a connection 32 to a respective pin 34 to transfer data to or from the pin 34. Additionally, each functional block 26 has a connection 30 to the microcontroller 12 to transfer to or receive from the microcontroller 12 the appropriate data.

Note that pins 36 and 38 have no functional blocks 26 coupled thereto. This is because these pins 36 and 38 are the power and ground supply pins for the package 10, and therefore, they require no functional blocks 26. Note that the individual power and ground lines from pins 36 and 38 are not shown for simplification of the drawing. Pins 34 represent either input only or I/O type pins, both of which are well known in the art. Which of pins 34 are input only and which are I/O type depends on the user's application. Note that the second pin 34 from the top left corner of the package 10 only has one functional block 26 coupled to it. Thus, this particular pin 34 has only one function associated with it. Note that this single function depiction is shown only for the purpose of demonstrating how a single function pin 34 would look. Thus, any of the pins 34 could be single function pins, or multiple function pin 34. Additionally, note that the other pins 34 are shown with two functional blocks 26 per pin 34, and therefor these pins 34 have two functions. In other words, the number of function per pin 34 equals the number of functional blocks associated with that pin 34. Accordingly, any of the pins 34 could have one, two, or more functional blocks 26 associated thereto. This is represented in the drawing by the dashed lines between the functional blocks 26. Additionally note the dashed lines between pins 34, which indicate that this package 10 could have more or less than eight pins 34–38, but the key is that the number of pins 34–38 is less than or equal to the data bus width of the microcontroller 12.

The pin function configuration portion of the package 10 is defined as simply one or more functional blocks 26. The internals of the functional blocks 26 are not shown for simplification of the drawing. The functions that pins 34–38 must support for a microcontroller 12 are well known to those skilled in the art such as Bi-Directional I/O Port pin, a Serial Programing Data pin, a Serial Programming Clock pin, and the like. The point is that there are many functions that pins 34–38 support for a microcontroller 12, they are all well known, and need not be specifically designated. Further, functional blocks 26, which enable a particular pin 34–38 to behave as required for a given function, are also well known in the art, and therefore need not be shown in detail. A key feature of the instant invention is that because pins 34 are multi-functional, only n pins 34–38 are required and all data control commands for the microcontroller 12 having an n-bit (i.e., 8-bit) data bus use the full n-bit bus.

OPERATION

Referring to FIG. 1, when executing an instruction, the microcontroller 12 sends appropriate control signals to the control register 16, which enables and disables the appropriate functional blocks 26 for a given pin 34. Note that since several functional blocks 26 can be used per pin 34, only one functional block can be enabled at a time. Data travels into the package 10 from a pin 34, through a corresponding connector 32, the enabled functional block 26, a corresponding connector 30, and to the microcontroller 12. The reverse path sends data from the microcontroller 12 out of a particular pin 34 of the package 10. Whether the flowpath of data be into or out of the microcontroller 12, the microcontroller 12 sends appropriate enable and disable signals to the appropriate functional blocks 26 in order to operate the desired pins 34 as required.

Although the invention has been particularly shown and described with reference to a preferred embodiment thereof, it will be understood by those skilled in the art that changes in form and detail may be made therein without departing from the spirit and scope of the invention.

What is claimed is:

1. An Integrated Circuit (IC) package comprising, in combination:

an IC chip with a microcontroller having a data bus;

a first pin electrically coupled to said microcontroller wherein said first pin functions as a power supply pin;

a second pin electrically coupled to said microcontroller wherein said second pin functions as a grounding pin; and a plurality of third pins electrically coupled to said microcontroller wherein said plurality of third pins are function pins, at least one of said plurality of third pins being a multiple function pin, a total number of said first pin, said second pin, and said plurality of third pins is at least three and one of less than or equal to a bus width of said data bus.

2. An IC package in accordance with claim 1 wherein each of said plurality of third pins are one of input only pins or input/output pins.

3. An IC package in accordance with claim 1 further comprising at least one configuration circuit coupled to each of said plurality of third pins and to said data bus for determining a function for a corresponding one of said plurality of third pins.

4. An IC package in accordance with claim 3 wherein only one of said at least one configuration circuit for each of said plurality of third pins is enabled at a time to configure a corresponding one of said plurality of third pins to a function associated with said one of said at least one configuration circuit which is enabled.

5. An IC package in accordance with claim 3 further comprising independent function lines coupled to each of said configuration circuits and to a corresponding one of said plurality of third pins for transferring data between said corresponding one of said plurality of third pins and said microcontroller when a particular one of said configuration circuits is enabled.

6. An IC package in accordance with claim 5 further comprising a signal bus coupled to said control register and to said microcontroller for sending signals from said microcontroller to said control register on which of said configuration circuits need to be enabled and which of said configuration circuits need to be disabled.

7. An IC package in accordance with claim 3 further comprising a control register coupled to said data bus for enabling and disabling each of said configuration circuits for determining a function for each of said plurality of third pins.

8. An IC package in accordance with claim 7 further comprising control signal lines coupled to said data bus and to each of said configuration circuits for transferring to each of said configuration circuits one of said enable and disable signals.

9. An IC package in accordance with claim 7 wherein said control register is a device which can hold a known state.

10. An IC package in accordance with claim 7 wherein said control register is a memory device.

11. An Integrated Circuit (IC) package comprising, in combination:

an IC chip with a microcontroller having a data bus;

a first pin electrically coupled to said microcontroller wherein said first pin functions as a power supply pin;

a second pin electrically coupled to said microcontroller wherein said second pin functions as a grounding pin;

a plurality of third pins electrically coupled to said microcontroller wherein said plurality of third pins are function pins, at least one of said plurality of third pins being a multiple function pin, a total number of said first pin, said second pin, and said plurality of third pins is at least three and one of less than or equal to a bus width of said data bus;

at least one configuration circuit coupled to each of said plurality of third pins and to said data bus for determining a function for a corresponding one of said plurality of third pins, wherein only one of said at least one configuration circuit for each of said plurality of third pins is enabled at a time to configure a corresponding one of said plurality of third pins to a function associated with said one of said at least one configuration circuit which is enabled;

independent function lines coupled to each of said configuration circuits and to a corresponding one of said plurality of third pins for transferring data between said corresponding one of said plurality of third pins and said microcontroller when a particular one of said configuration circuits is enabled;

control register coupled to said data bus for enabling and disabling each of said configuration circuits for determining a function for each of said plurality of third pins;

control signal lines coupled to said data bus and to each of said configuration circuits for transferring to each of said configuration circuits one of said enable and disable signals; and a signal bus coupled to said control register and to said microcontroller for sending signals from said microcontroller to said control register on which of said configuration circuits need to be enabled and which of said configuration circuits need to be disabled.

12. An IC package in accordance with claim 11 wherein each of said plurality of third pins are one of input only pins or input/output pins.

13. An IC package in accordance with claim 11 wherein said control register is a device which can hold a known state.

14. An IC package in accordance with claim 11 wherein said control register is a memory device.

* * * * *

/

(12) EX PARTE REEXAMINATION CERTIFICATE (7940th)
United States Patent
Fink et al.

(10) Number: US 5,847,450 C1
(45) Certificate Issued: Dec. 21, 2010

(54) MICROCONTROLLER HAVING AN N-BIT DATA BUS WIDTH WITH LESS THAN N I/O PINS

(75) Inventors: Scott Fink, Glendale, AZ (US); Gregory C. Bingham, Gilbert, AZ (US); Richard Hull, Chandler, AZ (US); Scott Ellison, Chandler, AZ (US)

(73) Assignee: Microchip Technology, Inc., Chandler, AZ (US)

Reexamination Request:
No. 90/007,873, Jan. 10, 2006

Reexamination Certificate for:
Patent No.: 5,847,450
Issued: Dec. 8, 1998
Appl. No.: 08/644,916
Filed: May 24, 1996

(51) Int. Cl.
*G06F 15/76* (2006.01)
*G06F 15/78* (2006.01)
*G11C 5/06* (2006.01)

(52) U.S. Cl. .................. 257/697; 257/723; 718/104
(58) Field of Classification Search .................. None
See application file for complete search history.

(56) References Cited

U.S. PATENT DOCUMENTS

| | | | |
|---|---|---|---|
| 4,349,870 A | 9/1982 | Shaw et al. .................. 364/200 |
| 4,742,215 A | 5/1988 | Daughters et al. | |
| 4,866,508 A | 9/1989 | Eichelberger et al. ......... 326/41 |
| 5,127,057 A * | 6/1992 | Chapman ..................... 381/86 |
| 5,179,716 A | 1/1993 | Agrawal et al. | |
| 5,351,216 A | 9/1994 | Salt et al. ............... 365/230.01 |
| 5,428,252 A | 6/1995 | Walker et al. .................. 307/64 |
| 5,455,455 A * | 10/1995 | Badehi ........................ 257/690 |
| 5,463,249 A | 10/1995 | Shinbo et al. ................ 257/690 |
| 5,469,557 A | 11/1995 | Salt et al. .................... 711/103 |
| 5,517,661 A | 5/1996 | Yokouchi | |
| 5,752,512 A * | 5/1998 | Gozani ........................ 600/347 |
| 5,781,746 A * | 7/1998 | Fleck .......................... 710/306 |
| 5,787,299 A * | 7/1998 | Ostler et al. .................. 712/39 |
| 6,243,654 B1 * | 6/2001 | Johnson et al. ............... 702/85 |
| 2003/0126507 A1 | 7/2003 | Ardissono et al. ............. 714/38 |
| 2005/0181341 A1 | 8/2005 | Ewing et al. ................. 434/262 |
| 2007/0198816 A1 * | 8/2007 | Ling .......................... 712/227 |

FOREIGN PATENT DOCUMENTS

| JP | 3 28985 A | 2/1991 |
|---|---|---|
| JP | 5 250497 A | 9/1993 |
| JP | 6314345 | 11/1994 |
| JP | 8 95744 A | 4/1996 |

OTHER PUBLICATIONS

Internet article entitled "Intel Microcontroller Families MCS–48, MCS–41, MCS–51, MCS–96" from The CPU-Shack [attached and also available at the following URL address: http://www.cpushack.net/IntelMicrocontrollers.html].*

(Continued)

*Primary Examiner*—Erik Kielin

(57) ABSTRACT

An Integrated Circuit (IC) package is disclosed comprising an IC chip with a microcontroller therein having an n-bit data bus, and up to n pins electrically coupled to the microcontroller. The IC package also includes a control register coupled to the microcontroller for receiving enable and disable signals from the microcontroller. One or more of the pins have one or more functional block associated thereto. Each functional block defines a specified function for its corresponding pin. Thus, each pin having a plurality of corresponding functional blocks has a number of potential functions equal to the number of corresponding functional blocks. The specific function for a given pin is selected by the enable signal from the control register which selects the appropriate functional block upon appropriate command from the microcontroller. BY using pins with multiple functions, the instant invention permits an n-bit architecture microcontroller to use less than or equal to n pins.

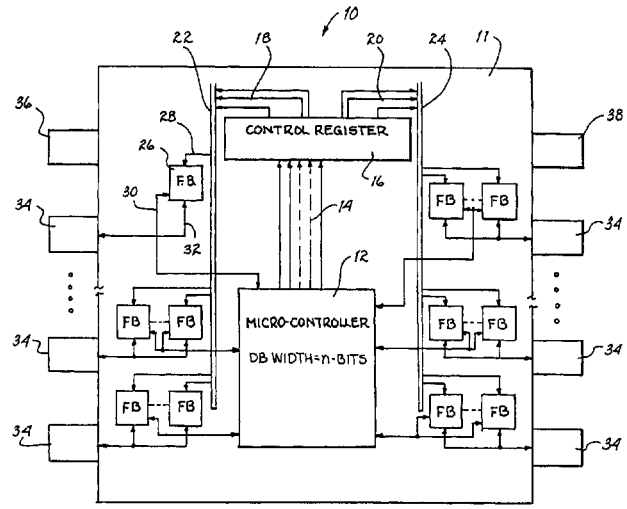

OTHER PUBLICATIONS

Internet article by Dr. Sandra I. Woolley, entitled "A Brief History of Microprocessors" [attached and also available at the following URL address: http://www.eee.bham.ac.uk/woolleysi/teaching/microhistory.htm].*
Derwent Abstract for EP 1 530 106 A2.*
Article entitled "Electronics Components", The Engineer, published Jan. 15, 2000, available at http://www.theengineer.co.uk/Articles/271491/+ELECTRONIC+COMPONENTS.htm.*
Jan Axelson, The Microcontroller Idea Book, Lakeview Research, Madison WI, 1994, 1997, pp. 6–7.
"Principles and Applications of EM–78 Series Chips" written by Ting–Ming Ke, 1996.
"8–bit microcontroller with OSD and VST 84C44X; 84C64X; 84C84X" by Philips Semiconductor, 1994.
"CMOS single–chip–8–bit microcontroller" by Philips Semiconductor, 1993.
"MOS integrated circuit µPD78C14(A)"by NEC, 1991.

The first page of the specification of P1C14000 controller published by microchip, 1996.
English Translation of Japanese Patent No. 3 28985 A (pp. 1–5), Feb. 7, 1991.
English Translation of Japanese Patent No. 5 250497A (13 pages), Sep. 28, 1993.
English Translation of Japanese Patent No. 8 95744 A (15 pages), Apr. 28, 1996.
"The Microcontroller Idea Book: Circuits, Programs, & Applications featuring the 8052–Basic Microcontroller," Jan Axelson, 6 pages, Oct. 1994.
"Electronic Circuits: Design and Applications," by Ulrich Tietze and Christoph Schenk, 6 pages, 1991.
"Materials for Electronic Packaging," by Deborah D.L. Chung at Butterworth–Heinemann, 9 pages, 1995.
Data sheet for Philips Semiconductors models MAB8048H/35HL, MAB8049H/39HL, and MAB8050H/40HL, "Single–Chip 8–Bit Microcontroller," Aug. 1990, pp. 29–54.

* cited by examiner

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-14 is confirmed.

* * * * *